: US005679601A

United States Patent [19]
Wu

[11] Patent Number: 5,679,601
[45] Date of Patent: Oct. 21, 1997

[54] LOCOS METHOD USING ENCAPSULATING POLYSILICON/SILICON NITRIDE SPACER

[75] Inventor: Shye-Lin Wu, Hsinchu, Taiwan

[73] Assignee: Powerchip Semiconductor Corp., Hsinchu, Taiwan

[21] Appl. No.: 763,282

[22] Filed: Dec. 10, 1996

[51] Int. Cl.[6] .................................................. H01L 21/76
[52] U.S. Cl. ...................... 437/69; 437/72; 437/73
[58] Field of Search .................... 437/69, 70, 72, 437/73

[56] References Cited

U.S. PATENT DOCUMENTS

| | | | |
|---|---|---|---|
| 5,175,123 | 12/1992 | Vaquez et al. | 437/69 |
| 5,393,692 | 2/1995 | Wu | 437/72 |
| 5,563,091 | 10/1996 | Lee | 437/69 |
| 5,612,248 | 3/1997 | Jeng | 437/69 |

*Primary Examiner*—Trung Dang
*Attorney, Agent, or Firm*—Bacon & Thomas

[57] ABSTRACT

An improved local oxidation of silicon (LOCOS) method using encapsulating polysilicon/silicon nitride spacer is disclosed. The method includes forming a pad oxide layer on a semiconductor substrate and forming a first silicon nitride layer on the pad oxide layer. The pad oxide layer and the first silicon nitride layer are then patterned and etched by a photoresist mask to define an active region. After removing a portion of the pad oxide layer, an undercut between the first silicon nitride layer and the substrate is formed. A silicon oxide layer is thereafter formed on the substrate, and a polysilicon layer is formed to encapsulate the first silicon nitride layer, the pad oxide layer and the silicon oxide layer. Next, a second silicon nitride layer is formed and etched back to form a silicon nitride spacer on the sidewalls of the polysilicon layer. Using the silicon nitride spacer as a mask, portions of the second silicon nitride layer, the polysilicon layer, the silicon oxide layer and the substrate are etched, and an isolation oxide is finally grown on the substrate using the spacer as a mask.

18 Claims, 4 Drawing Sheets

LOCOS METHOD USING ENCAPSULATING POLYSILICON/SILICON NITRIDE SPACER

BACKGROUND OF THE INVENTION

1. Field of the Invention

The present invention relates to a method of forming isolation regions, and more particularly to an improved local oxidation of silicon (LOCOS) method via the use of encapsulating polysilicon/silicon nitride spacer.

2. Description of the Prior Art

The art of isolating semiconductor devices becomes one important aspect of modem metal-oxide-semiconductor (MOS) and bipolar integrated circuit technology as many as hundreds of thousands of devices are used in a single chip. Improper isolation among transistors will cause current leakage, which can consume significant power for the entire chip. In addition, improper isolation can further escalate latchup to damage the circuit function momentarily or permanently. Still further, improper isolation can result in noise margin degradation, voltage shift or crosstalk.

In MOS technology, isolation is usually practiced by forming the isolation regions between neighboring active regions. Typically, an isolation region is formed by ion-doping a channel stop layer of polarity opposite to the source electrode and the drain electrode of the integrated circuit device, and growing a thick oxide, often referred to as field oxide (FOX). The channel stop and the FOX cause the threshold voltage in the isolation region to be much higher than those of the neighboring active devices, making surface inversion not occur under the field oxide region.

Local oxidation of silicon (LOCOS) method is widely used to isolate active regions in silicon. In LOCOS technology, silicon nitride layer is used as an efficient oxidation mask which prevents the oxidants from reaching the silicon surface covered by silicon nitride. In addition, the silicon nitride layer oxidizes very slowly compared to silicon. However, direct deposition of silicon nitride on silicon can cause stress-induced defects when the structure is subjected to oxidation at elevated temperature. These defects can be considerably reduced by forming a thin (100~500 angstroms) pad oxide layer between silicon and silicon nitride. The pad oxide reduces the force transmitted to silicon by relieving the stress. It acts as a buffer which cushions the transition of stress between silicon and silicon nitride.

Unfortunately, the pad oxide layer provides a lateral path for oxidation of silicon. This lateral extension of oxidation through pad oxide is frequently called bird's beak because of its form. The extent of the bird's beak can be reduced by decreasing the thickness of the pad oxide, which, however will cause more stress-induced defects from the above silicon nitride layer. Therefore, the thickness of the pad oxide and the silicon nitride layer must be optimized to minimize the extent of the bird's beak without generating defects.

Several methods in the prior art have been designed for improving LOCOS isolation process to minimize the bird's beak. For example, the sealed-interface local oxidation (SILO) process uses an additional thin silicon nitride film over the silicon substrate followed by forming an oxide layer and a thick silicon nitride layer. The SILO can reduce the bird's beak, but at the expense of generating more stress, more crystal defects, and higher leakage currents. See pp.554–561, of J. Hui, et al., "Sealed-interface local oxidation technology," *IEEE Trans. Electron Devices*, vol. ED-29, 1982. Another improved LOCOS method, called buried oxide (BOX) process, has been devised which uses an aluminum mask to etch a silicon groove and then subsequently remove a plasma deposited silicon dioxide layer. The BOX process can effectively reduce the bird's beak but, however, at the expense of manufacture complexity. See pp.384–387, of K. Kurosawa, et al., "A new bird's beak free field isolation technique for VLSI Devices," *IEDM Tech. Dig.*, 1981.

Beside bird's beak effect, another important limitation is the sharp decrease in the field oxide thickness as the isolation spacing is reduced below 1 micrometer. As the width of the isolation region decreases, the resultant field oxide becomes thinner. This effect is frequency called field oxide thinning effect, and is more serious for deep submicron semiconductor devices. See p.671, of A. Bryant, et al., "Characteristics of CMOS device isolation for the ULSI age," *IEDM*, 1994.

SUMMARY OF THE INVENTION

In accordance with the present invention, a method is provided for forming a field oxide region that substantially suppresses the bird's beak effect and the oxidation stress, and improves the field oxide thinning effect. In one embodiment, a pad oxide layer, having a thickness of 200~1000 angstroms, is grown at about 800°–1100° C. in a conventional furnace. Then, a silicon nitride layer with a thickness of 500–3000 angstroms is deposited, for example, using low pressure chemical vapor deposition (LPCVD) process. Thereafter, a photoresist masking layer having active region pattern is formed over the silicon nitride layer.

The silicon nitride layer and the pad oxide are removed anisotropically using the photoresist pattern as a mask, via use of a dry etching process.

Portions of the pad oxide is undercut. Typically, a wet etchant such as diluted hydrofluoric (HF) solution is used for its advantage of dissolving silicon dioxide without attacking silicon and silicon nitride. Practically, the HF is mixed with ammonium fluoride ($NH_4F$), known as buffered oxide etching (BOE), to slow down the etch rate for a controllable process.

Another thin silicon dioxide layer, having a thickness of about 0–300 angstroms, is grown on the silicon substrate. Then a thin polysilicon layer with a thickness of 0–300 angstroms is deposited using low pressure CVD by the decomposition of silane or ultra-high vaccum CVD (UHVCVD) at about 450°–700° C. at a pressure of about 0.05~2.0 torr.

Next, a thin (30~500 angstroms) silicon nitride layer is deposited using conventional chemical vapor deposition (LPCVD) or plasma-enhanced chemical vapor deposition (PECVD). Thereafter, the silicon nitride layer is etched back via use of a reactive ion etch process (RIE) to form a spacer.

Thereafter, portions of the polysilicon layer, the silicon oxide layer and the substrate are etched using the spacer as a mask, thereby resulting in a recessed substrate. This etching process is preferrably performed using reactive ion etch or plasma etch. For fabricating deep sub-micron semiconductor devices, which have narrower isolation regions, the recessed substrate can result in thicker field oxides beneath the silicon substrate. However, this recess of the substrate can be omitted for those semiconductor devices having isolation spacing larger than 1 micrometer.

Finally, a field oxide having a thickness of about 3000~8000 angstroms, is grown in a conventional furnace at about 900°–1100° C. Accordingly, a field isolation with little or no bird's beak is achieved by combining conventional LOCOS with the encapsulating polysilicon/silicon nitride spacers technology of the present invention. Further, the oxidation stress can be minimized using the encapsulating polysilicon layer as a buffer layer. After the silicon nitride layer, the polysilicon layer, the silicon nitride spacer, and the pad oxide are conventionally removed using suitable etching method, a semiconductor device such as metal-oxide-semiconductor (MOS) transistor can be fabricated between the field oxide regions.

DESCRIPTION OF THE PREFERRED EMBODIMENT

Figure 1:
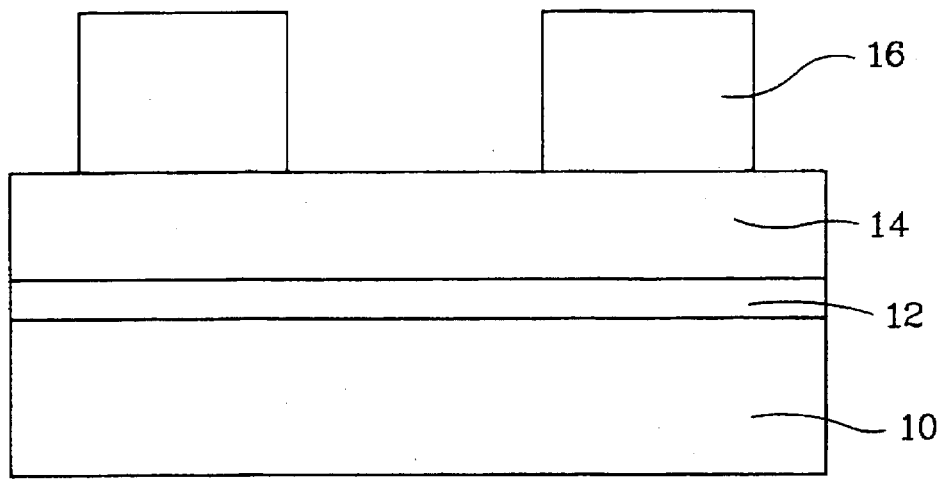
FIGS. 1 to 10 illustrate schematically cross-sectional views of the structure formed at various stages in the fabrication of an isolation region in accordance with the invention.

FIG. 1 shows a schematic cross-section of a semiconductor substrate 10. A silicon oxide layer 12, having a thickness of 200~1000 angstroms, is grown at about 800°~1000° C. in a conventional furnace. Then, a silicon nitride layer 14 is deposited, for example, using low pressure chemical vapor deposition (LPCVD) process. The silicon nitride layer 14 has a thickness of about 500~3000 angstroms. The silicon oxide layer 12 is frequency called pad oxide in isolation technology, and is used to reduce the force transmitted from the silicon nitride layer 14 to the substrate 10. The silicon nitride layer 14 is, however, used as an oxidation mask which prevents the oxidants from reaching the substrate surface under the silicon nitride layer 14 in a later oxidation step. Thereafter, a photoresist masking layer 16 having active region pattern is formed over the silicon nitride layer 14. This pattern is defined using well known photoresist coating, exposure and development processes.

Figure 2:
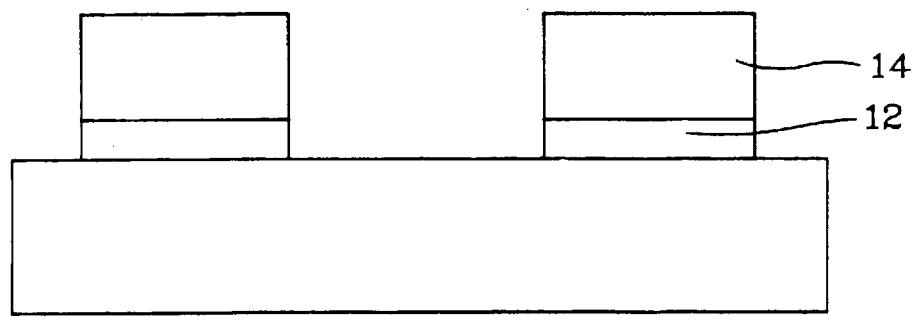

FIG. 2 shows the structure alter the silicon nitride layer 14 and the pad oxide 12 are removed anisotropically using the photoresist pattern 16 as a mask, via use of a dry etching process.

Figure 3:
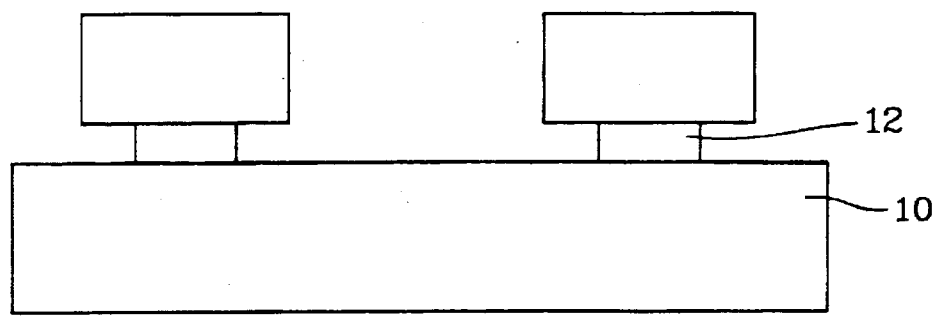

FIG. 3 shows the step of oxide undercut to etch isotropically portions of the pad oxide 12 away. The lateral undercut depth is between 0 and 1000 angstroms. Typically, a wet etchant such as diluted hydrofluoric (HF) solution is used for its advantage of dissolving silicon dioxide without attacking silicon and silicon nitride. Practically, the HF is mixed with ammonium fluoride ($NH_4F$), known as buffered oxide etching (BOE), to slow down the etch rate for a controllable process.

Figure 4:
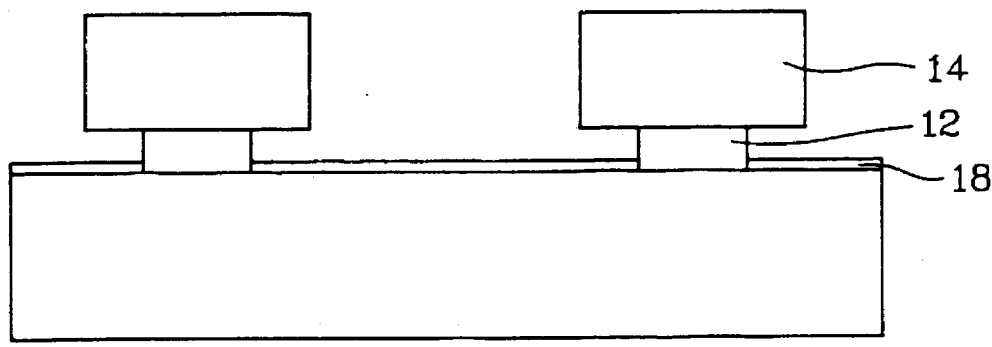

Referring to FIG. 4, another thin silicon dioxide layer 18, having a thickness of about 0~300 angstroms, is grown on the silicon substrate 10. Noticeably, little silicon oxide is grown on the silicon nitride 14 because the silicon nitride oxidizes very slowly compared to silicon.

Figure 5:
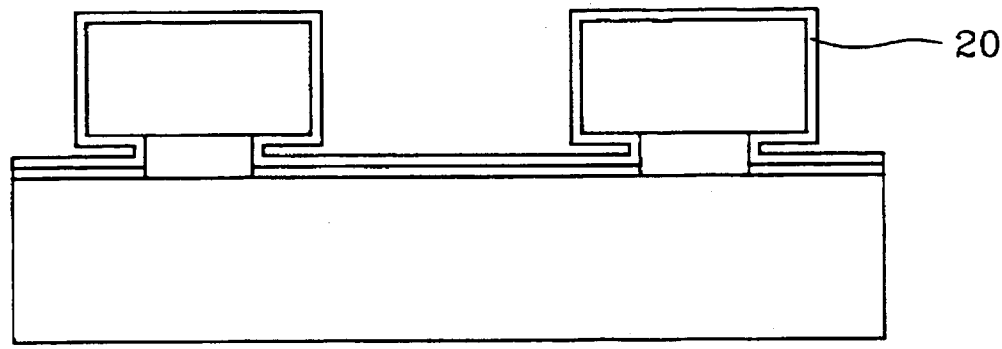

As illustrated in FIG. 5, a polysilicon layer 10, having a thickness of about 30~300 angstroms, is deposited using low pressure CVD or ultra-high vaccum CVD (UHVCVD). In this embodiment, the LPCVD process forms the polysilicon layer 20 by the decomposition of silane at about 450°~700° C. at a pressure of about 0.05~2.0 torr, according to the reaction:

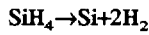

or

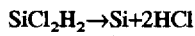

Figure 6:
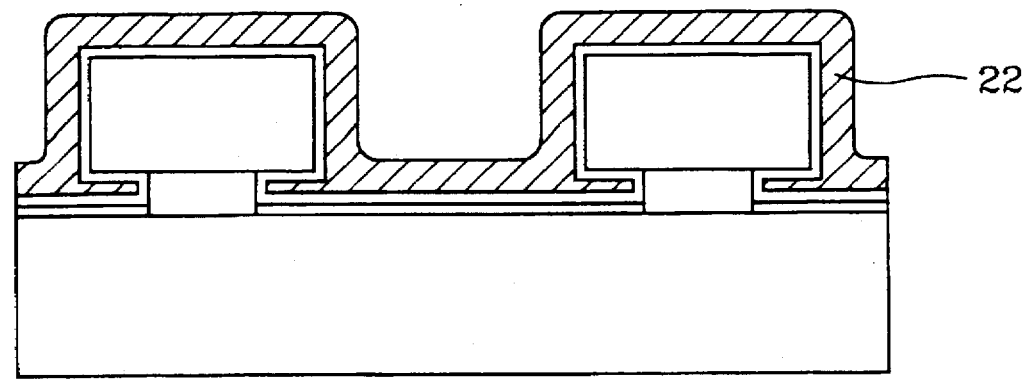
Figure 7:
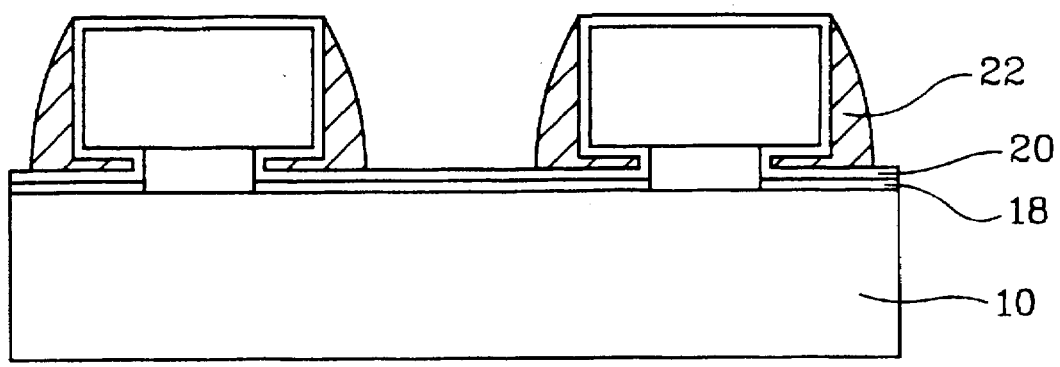

Next, as shown in FIG. 6, a thin (30~500 angstroms) silicon nitride layer 22 is deposited using conventional chemical vapor deposition (LPCVD) or plasma-enhanced chemical vapor deposition (PECVD) over the resultant structure of FIG. 5. Thereafter, the silicon nitride layer 22 is etched back via use of a reactive ion etch process (RIE) to form a spacer 22, as shown in FIG. 7.

Figure 8:
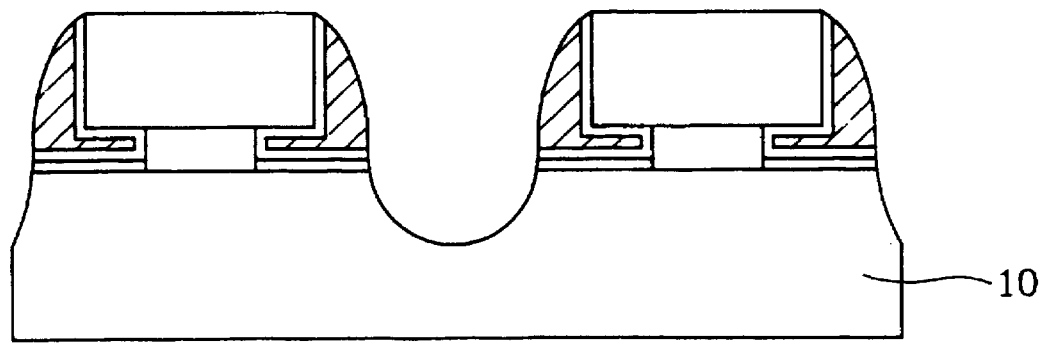

Portions of the polysilicon layer 20, the silicon oxide layer 18 and the substrate 10 are etched using the silicon nitride spacer 22 as a mask, therefore resulting in a recessed substrate 10 as shown in FIG. 8. The silicon substrate 10 is recessed from 0 to 2000 angstroms. This etch process is preferrably performed using reactive ion etch or plasma etch. For fabricating deep sub-micron semiconductor devices, which have narrower isolation regions, the recessed substrate can result in thicker field oxides. However, this recess of the substrate 10 can be omitted for those semiconductor devices having isolation spacing larger than 1 micrometer.

Figure 9:
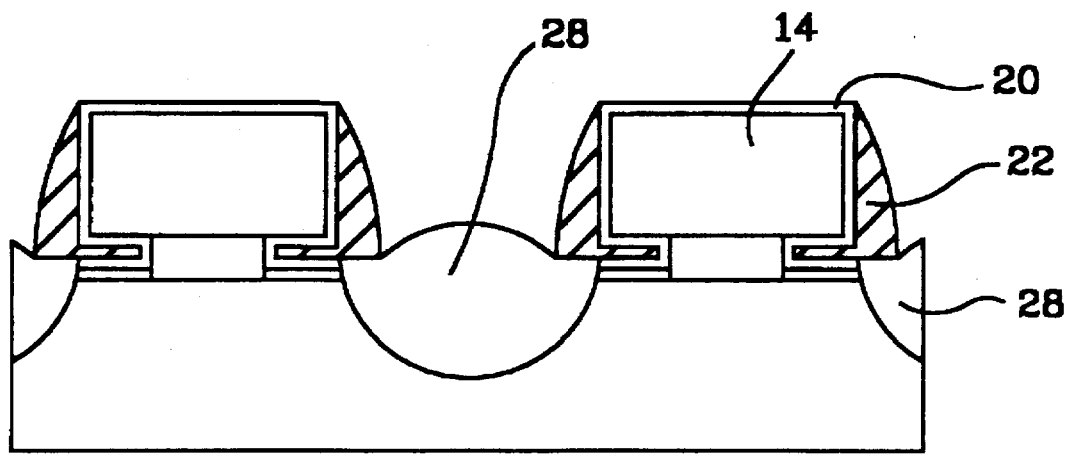
Figure 10:
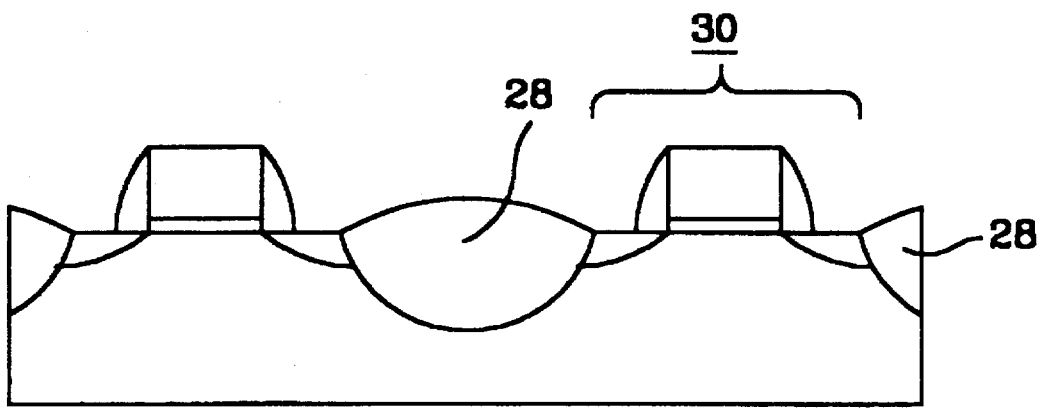

Finally, a field oxide 28, having a thickness of about 3000~8000 angstroms, is grown in a conventional furnace at about 900°~1100° C. as shown in FIG. 9. Accordingly, a field isolation with little or no bird's beak is achieved by combining conventional LOCOS with the encapsulating polysilicon/silicon nitride spacer technology of the present invention. Further, the oxidation stress can be minimized using the encapsulating polysilicon layer as a buffer layer. After the silicon nitride layer 14, the polysilicon layer 20, the silicon nitride spacer 22, the pad oxide 12 and the silicon oxide layer 18 are conventionally removed using suitable etching method, a semiconductor device such as metal-oxide-semiconductor (MOS) transistor 30 can be fabricated between the field oxide regions 28.

Although specific embodiment has been illustrated and described, it will be obvious to those skilled in the art that various modifications may be made without departing from the spirit which is intended to be limited solely by the appended claims.

What is claimed is:

1. A method for forming an isolation region, said method comprising:

forming a pad oxide layer on a semiconductor substrate;

forming a first silicon nitride layer on the pad oxide layer;

patterning and etching the pad oxide layer and the first silicon nitride layer to define an active region by a photoresist mask;

removing a portion of the pad oxide layer to form an undercut between the first silicon nitride layer and the substrate;

forming a silicon oxide layer on the substrate;

forming a polysilicon layer to encapsulate the first silicon nitride layer, the pad oxide layer and the silicon oxide layer;

forming a second silicon nitride layer over the polysilicon layer;

etching a portion of the second silicon nitride layer to form a silicon nitride spacer on the sidewalls of the polysilicon layer;

etching portions of the second silicon nitride layer, the polysilicon layer, the silicon oxide layer and the substrate using said silicon nitride spacer as a mask; and forming an isolation region on the substrate, said spacer serving as a mask.

2. The method according to claim 1, wherein the thickness of the removed portion of the substrate is between 0 and 2000 angstroms.

3. The method according to claim 1, wherein the lateral depth of the undercut is between 0 and 1000 angstroms.

4. The method according to claim 1, wherein said portion of the substrate is etched using a reactive ion etch (RIE) method.

5. The method according to claim 1, wherein said portion of the substrate is etched using a plasma etch method.

6. The method according to claim 1, wherein said undercut is formed using a wet etch, a diluted hydrofluoric (HF) solution serving as an etchant.

7. The method according to claim 1, wherein said undercut is formed using a wet etch, a buffered oxide etch (BOE) serving as an etchant.

8. A method for forming an isolation region, said method comprising:

forming a pad oxide layer on a semiconductor substrate;

forming a first silicon nitride layer on the pad oxide layer;

pattenting and etching the pad oxide layer and the first silicon nitride layer to define an active region by a photoresist mask;

removing a portion of the pad oxide layer to form an undercut between the first silicon nitride layer and the substrate;

forming a polysilicon layer to encapsulate the first silicon nitride layer, the pad oxide layer and the substrate;

forming a second silicon nitride layer over the polysilicon layer;

etching a portion of the second silicon nitride layer to form a silicon nitride spacer on the sidewalls of the polysilicon layer;

etching portions of the second silicon nitride layer, the polysilicon layer and the substrate using said silicon nitride spacer as a mask; and forming an isolation region on the substrate, said spacer serving as a mask.

9. The method according to claim 8, wherein the thickness of the removed portion of the substrate is between 0 and 2000 angstroms.

10. The method according to claim 8, wherein the lateral depth of the undercut is between 0 and 1000 angstroms.

11. The method according to claim 8, wherein said portion of the substrate is etched using a reactive ion etch (RIE) method.

12. The method according to claim 8, wherein said portion of the substrate is etched using a plasma etch method.

13. The method according to claim 8, wherein said undercut is formed using a wet etch, a diluted hydrofluoric (HF) solution serving as an etchant.

14. The method according to claim 8, wherein said undercut is formed using a wet etch, a buffered oxide etch (BOE) serving as an etchant.

15. A method for forming an isolation region, said method comprising:

forming a pad oxide layer on a semiconductor substrate;

forming a first silicon nitride layer on the pad oxide layer;

patterning and etching the pad oxide layer and the first silicon nitride layer to define an active region by a photoresist mask;

removing a portion of the pad oxide layer to form an undercut between the first silicon nitride layer and the substrate;

forming a silicon oxide layer on the substrate;

forming a polysilicon layer to encapsulate the first silicon nitride layer, the pad oxide layer and the silicon oxide layer;

forming a second silicon nitride layer over the polysilicon layer;

etching a portion of the second silicon nitride layer to form a silicon nitride spacer on the sidewalls of the polysilicon layer;

etching portions of the second silicon nitride layer, the polysilicon layer and the silicon oxide layer using said silicon nitride spacer as a mask; and forming an isolation region on the substrate, said spacer serving as a mask.

16. The method according to claim 15, wherein the lateral depth of the undercut is between 0 and 1000 angstroms.

17. The method according to claim 15, wherein said undercut is formed using a wet etch, a diluted hydrofluoric (HF) solution serving as an etchant.

18. The method according to claim 15, wherein said undercut is formed using a wet etching, a buffered oxide etch (BOE) serving as an etchant.

* * * * *